Sept. 16, 1958 P. W. CRAPUCHETTES 2,852,678

VARIABLE FREQUENCY MICROWAVE OSCILLATOR

Filed Aug. 15, 1955 3 Sheets-Sheet 1

INVENTOR.
PAUL W. CRAPUCHETTES
BY
Seymour M. Rosenberg
ATTORNEY

INVENTOR.
PAUL W. CRAPUCHETTES
BY
Seymour M. Rosenberg
ATTORNEY

INVENTOR.
PAUL W. CRAPUCHETTES
BY
Seymour M. Rosenberg
ATTORNEY

United States Patent Office 2,852,678

Patented Sept. 16, 1958

2,852,678

VARIABLE FREQUENCY MICROWAVE OSCILLATOR

Paul W. Crapuchettes, Atherton, Calif., assignor to Litton Industries of California, Beverly Hills, Calif.

Application August 15, 1955, Serial No. 528,159

13 Claims. (Cl. 250—36)

This invention relates to a variable frequency microwave oscillator and more particularly to an electronically tunable microwave oscillator which employs a pair of tightly coupled microwave oscillator sections, which are respectively tuned to two preselected frequencies, for generating an output signal whose frequency is variable over a relatively large frequency spectrum delimited by the preselected frequencies.

In recent years, and especially since the advent of radar and microwave systems in general, a great deal of effort has been expended to develop electronically tunable microwave oscillators for generating variable frequency microwave signals at relatively high power and over a relatively broad frequency spectrum. Among the most obvious applications of this form of oscillator are its use for microwave transmission of intelligence information such as television signals, its use as a countermeasure jamming signal generator, and its use as an automatic frequency controlled radar signal generator whose frequency of operation may be easily changed electronically to another frequency over a relatively large bandwidth.

Although collateral efforts in the prior art have succeeded in producing mechanically tunable magnetron and klystron microwave oscillators, these devices are inherently limited in the speed with which they are capable of shifting frequency owing principally to the fact that they rely on a mechanical movement of one or more tuning elements within a resonant cavity to vary the reactance of the cavity. Consequently, the need has continued for an electronically tunable, high power and broadband microwave signal generator capable of shifting frequency at a rapid rate.

The efforts of the prior art have succeeded in developing several electronically tuntable microwave oscillators such as reflex klystrons, electron-beam tuned magnetrons, and magnetrons employing what is termed diode tuning. However, each of these devices is inherently limited in one or more particulars from fulfilling the needs of the art. For example, although reflex klystrons have been found to be especially suitable as local oscillators in microwave receivers and are readily controllable electronically, they are nevertheless extremely limited in the amount of microwave power they can produce.

The electronically tunable magnetrons of the prior art, on the other hand, are capable of producing relatively large amounts of power and may be rapidly shifted in frequency but are inherently limited to narrow band operation. For example, electron-beam tuned magnetrons, which normally employ one or more electron guns for projecting an electron stream through either an externally coupled cavity resonator or through the capacitive portion of the anode cavities, are usually limited to a bandwidth of the order of 10 megacycles at X-band. In a similar manner, magnetrons employing diode-tuning are limited to a total frequency deviation which is less than one percent of the center frequency of their spectrum; a typical example of this type of microwave variable frequency oscillator is disclosed in U. S. Patent No. 2,472,200, issued June 7, 1949, to E. Everhart for "Variable Frequency Magnetron Circuit."

The present invention, on the other hand, provides a broad band, high power and electronically tunable microwave oscillator which includes two tightly coupled microwave oscillator sections each of which has been tuned to a predetermined frequency different from the frequency of the other, the combination of the two oscillators being operable in synchronism and under the control of a common input power source to provide at a common output circuit an output signal whose frequency is shiftable electronically by varying the relative input powers to the oscillators.

The phenomenon of oscillator synchronization per se, of course, has been known for many years. For example, it has long been recognized that two adjacent oscillators operating at relatively close frequencies often tend to synchronize with each other, the most stable oscillator of the two being most effective in determining the frequency at which the oscillators lock. One theoretical explanation of this phenomenon is set forth on page 1415 of the December 1947 issue of the Proceedings of the IRE in an article entitled "Synchronization of oscillators" by Huntoon and Weiss.

Although the fact that oscillators may be synchronized has been investigated vigorously for several decades, suprisingly few electrical circuits have been invented which make use of this phenomenon; instead the tendency of oscillators to synchronize is generally though of as erratic behavior on the part of one oscillator when spurious signals are induced in its circuit from a neighboring oscillator. One of the few applications of the phenomenon of oscillator synchronization has been to employ a low power oscillator of exceptional stability for stabilizing the frequency of a high power oscillator which in turn is employed to drive a load. Still another suggested application is to obtain amplification of a frequency modulated signal by introducing the signal into a relatively unstable high power oscillator circuit and thereby generate a similar signal at higher power.

In the microwave art the only application of oscillator synchronization thus for suggested has been to couple two or more fixed-frequency magnetrons together to produce a very high power output signal at a single frequency. However, high power oscillators of this type have been considered impractical if not inoperative owing to the fact that the relatively loose intercoupling of relatively stable microwave oscillators produces moding phenomena and consequently the output signal extracted has a relatively unpredictable frequency instead of the fixed and stable frequency desired.

The electronically tunable microwave oscillator of the invention, on the other hand, utilizes the phenomenon of oscillator synchronization by tightly coupling together two microwave oscillator sections which are respectively tuned to two frequencies that are separated by a frequency band which may be as large as ten percent of the center frequency of the band. By then varying the relative input power to the individual oscillator sections the frequency of their output signal may be made to vary across substantially the entire frequency band, the frequency of the output signal shifting toward the preselected frequency of the oscillator section whose relative input power is increasing.

According to a preferred embodiment of the invention there is provided a microwave frequency modulated signal generator which includes two magnetrons which are tuned to different frequencies and whose output circuits are interconnected, the input circuits to the magnetrons being connected to a common modulator which functions to vary the input power to the magnetrons relative to each other in accordance with a modulating signal. Owing to the fact that the two oscillator tubes synchronize with each other at a frequency determined by the relative power inputs to the devices, the output signal from the tubes is thus shiftable across a relatively broad frequency band, the ends of which are delimited substantially by the preselected frequencies to which the magnetrons are tuned.

According to another embodiment of the invention the two magnetrons may be utilized merely as an electronically tunable microwave oscillator for operating at any preselected frequency within a relativel broad frequency range. In this embodiment of the invention, of course, the input power source of the magnetrons may be electronically servoed to maintain the output signal at the preselected frequency. It will also be recognized from the description set forth hereinafter that the input power source or modulator may be constructed to operate the magnetrons in push-pull or that one magnetron may be operated at substantially constant power input while the input power to the other is varied in accordance with the modulating signal.

It is therefore an object of the invention to provide an electronically tunable microwave oscillator which employs at least two interconnected microwave oscillator sections, each of which is tuned to a different frequency, for generating a microwave output signal the frequency of which may be varied over a relatively broad bandwidth.

Another object of the invention is to provide an electronically tunable microwave oscillator which employs a pair of synchronized magnetrons which have been tuned to different frequencies to produce an output signal that varies in frequency in accordance with variations in the relative input powers to the magnetrons.

A further object of the invention is to provide a microwave frequency modulated signal generator which is operable by varying the relative input powers to a pair of interconnected and synchronized microwave oscillator tubes whose normal frequencies of operation are different.

Still another object of the invention is to provide a broadband microwave frequency modulated signal generator which is operable by varying the relative input powers to a pair of synchronized magnetrons whose output circuits are coupled together, the magnetrons being tuned to two different frequencies on opposite ends of the frequency spectrum over which the signal generated is capable of varying.

A still further object of the invention is to provide a frequency modulated microwave signal generator wherein the modulating signal is applied to a common input power source of a pair of synchronized magnetrons, each of which is tuned to a different frequency, to operate the magnetrons in push-pull and thereby modulate the output signal from the magnetrons in accordance with variations in the amplitude of the modulating signal.

It is also an object of the invention to provide a broadband electronically tunable microwave oscilliator which utilizes at least two tightly intercoupled oscillator sections having two independently controllable electron streams but two closely coupled electromagnetic fields.

The novel features which are believed to be characteristic of the invention, both as to its organization and method of operation, together with further objects and advantages thereof, will be better understood from the following description considered in connection with the accompanying drawings in which several embodiments of the invention are illustrated by way of example. It is to be expressly understood, however, that the drawings are for the purpose of illustration and description only, and are not intended as a definition of the limits of the invention.

Figure 1:
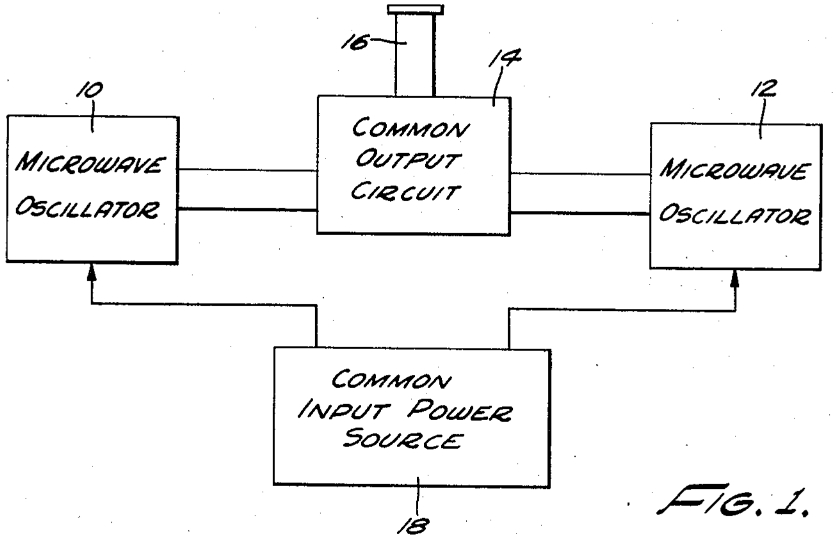
Fig. 1 is a block diagram illustrating the basic components of the electronically tunable microwave oscillator of the invention.

Referring now to the drawings wherein like or corresponding parts are designated by the same reference characters throughout the several views, there is shown in Fig. 1 a block diagram of the electronically tunable microwave oscillator of the invention illustrating its fundamental structure. Basically the variable frequency oscillator of the invention comprises a pair of microwave oscillator sections 10 and 12, each of which is tuned to a preselected frequency different from the frequency of the other, a common output circuit 14 for interconnecting oscillator sections 10 and 12 and combining the output signals therefrom to present a single output signal at an output waveguide 16, and a common input power source 18 which is connected to both oscillator sections and which is operative to vary the relative input powers to the oscillators.

In accordance with the motivating concept of the invention, oscillator sections 10 and 12 may be magnetrons, reflex klystrons or other forms of microwave oscillators capable of generating microwave signals at a preselected frequency. As will be set forth in more detail hereinbelow, it is an essential feature of the invention that the two oscillator sections be tuned to two different preselected frequencies, or frequency bands, the bandwidth of the variable frequency oscillator herein disclosed being determined at least in part by the frequency band separating the two selected frequencies or frequency bands. Inasmuch as the extent of the frequency band over which two oscillators will synchronize is also determined in part by the susceptibility of the oscillators to being influenced by each other, it is also essential that the resonators of the oscillator sections be relatively tightly intercoupled if the output signal derived from the oscillator sections is to vary over a relatively broad frequency band.

Consider now the operation of the electronically tuned variable frequency oscillator of the invention as shown in Fig. 1. Assume first that oscillator sections 10 and 12 are substantially identical with the exception that section 10 is capable of normally generating an output signal at a first predetermined frequency $f_1$ while section 12 is capable or normally generating an output signal at a second predetermined frequency $f_2$, the frequency band between frequencies $f_1$ and $f_2$ constituting any percentage up to approximately ten percent of the center frequency of the band. In addition, assume that the output circuits of both oscillator sections are coupled together relatively tightly by common output circuit 14. If now the oscillator sections are simultaneously and equally energized from input power source 18 it will be found that the output signal appearing at output waveguide 16 has a frequency $f_0$ intermediate frequencies $f_1$ and $f_2$, or approximately $$\frac{f_1+f_2}{2}$$

If now the power to oscillator section 10 is increased relative to the input power supplied to oscillator section 12, the frequency of the output signal will shift toward frequency $f_1$; conversely, if the power to oscillator section 12 is increased relative to the power supplied to section 10, the frequency of the output signal will shift toward frequency $f_2$. Accordingly, if the relative input powers to the oscillator sections are properly selected, the electronically tuned oscillator of the invention may be made to oscillate at almost any desired frequency between frequencies $f_1$ and $f_2$, thereby providing a variable frequency oscillator which may be electronically tuned to any desired frequency over a relatively broad bandwidth.

It will be recognized, of course, that if the electronically tunable microwave oscillator of the invention is to be employed as a variable frequency oscillator for generating an output signal at one particular frequency, the output signal from output waveguide 16 may be applied to an automatic frequency control system to develop an error signal for servoing the common input source to maintain constant the frequency of oscillation of the synchronized oscillator sections. Inasmuch as numerous automatic frequency control systems are well known to the art, such as those developed for use with reflex klystrons, further discussion of the applicability of automatic frequency control to the oscillator of the invention is considered unnecessary.

With reference once more to Fig. 1, it should also be pointed out that the output power which may be extracted from the electronically tunable oscillator of the invention is dependent not only upon the type and specifications of the microwave oscillator tube or tubes employed therein, but is also dependent upon the structure of the common output circuit and the manner in which the relative input power to the oscillators is varied. For example, if the input powers to oscillator sections 10 and 12 are varied in push-pull so that an increase in the power to one oscillator is accompanied by a corresponding decrease in the power to the other, the power output of the system for a given output circuit may be maintained substantially constant. In addition, if the oscillator sections are energized in push-pull from substantially zero power to full power, the frequency of the output signal is shiftable almost linearly over substantially the entire frequency range separating the two preselected frequencies to which the individual oscillator sections are respectively tuned.

On the other hand, if the first oscillator section is operated at substantially constant power while the input power to the second oscillator section is varied to obtain a variation in frequency, the available output power and consequently the amplitude of the output signal will be amplitude modulated in accordance with the variations in the input power to the second oscillator section. In addition, the frequency range over which the output signal may shift will be decreased since the operation of one oscillator section at constant input power will prevent the frequency of the output signal from ever shifting to the preselected frequency to which the other oscillator section has been tuned. In view of the foregoing discussion, therefore, it is clear that push-pull operation of oscillator sections 10 and 12 is to be preferred if constant output power and maximum frequency deviation are desired.

Figure 2:
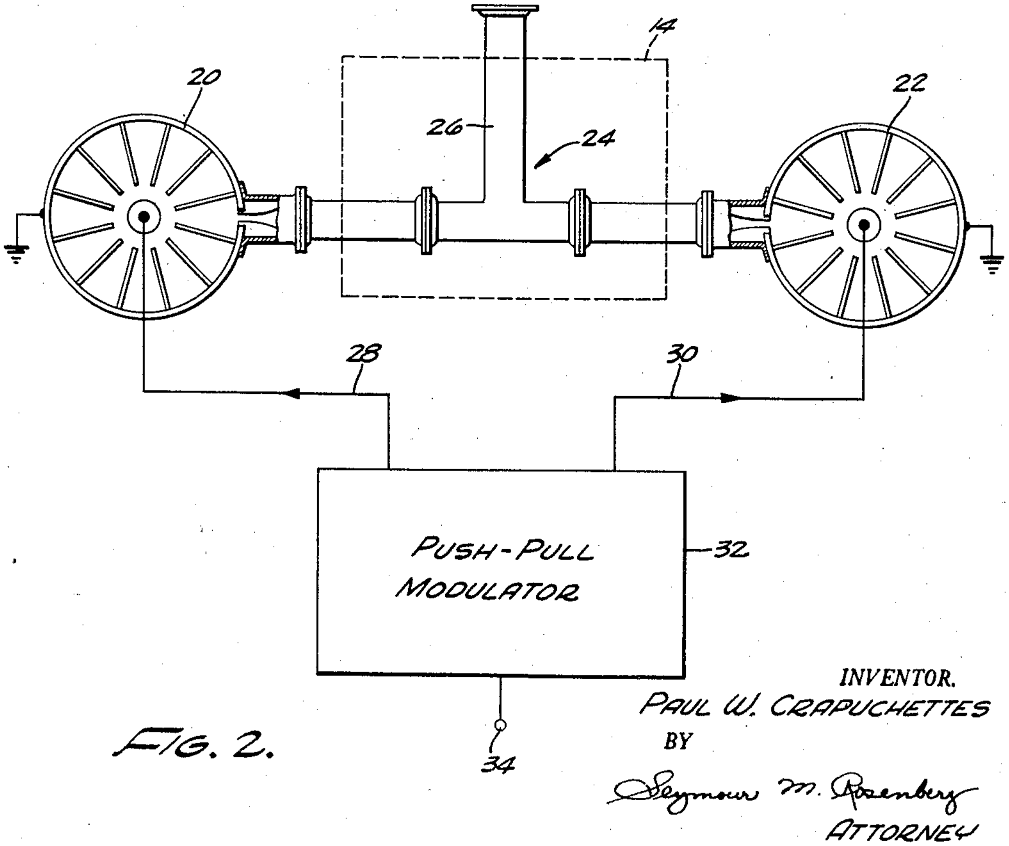
Fig. 2 is a block diagram, partly in schematic form, of a frequency modulated signal generator embodying the tunable microwave oscillator of the invention.

As set forth hereinabove, the electronically tunable variable frequency oscillator of the invention may also be utilized for generating a frequency modulated microwave signal by varying the relative input powers to the two oscillator sections in accordance with variations in the magnitude of a modulating signal. With reference now to Fig. 2, there is shown a frequency modulated signal generator, according to the invention, which includes a pair of magnetrons 20 and 22 which have been individually tuned to frequencies $f_1$ and $f_2$, respectively, the output waveguides from the magnetrons being interconnected within common output circuit 14 by a simple H-plane T-duplexer 24 whose series arm 26 provides a common output circuit for the magnetrons. As shown in Fig. 2, the magnetron anodes are grounded while the cathodes are connected over a pair of conductors 28 and 30 to a common modulator 32 which is operative to modulate the input power to the magnetrons in push-pull in accordance with variations in a modulating signal applied to an input terminal 34.

It will be recognized that the utilization of a conventional T junction as a duplexer provides a very simple and inexpensive output structure while simultaneously providing the desired relatively tight coupling between the magnetrons. It will also be recognized that the line length between each magnetron and the junction of the duplexer is preferably an integral number of half wave lengths at the center frequency of the frequency band over which the system is capable of operating. It should also be pointed out, however, that the invention is not to be limited by this particular selection of line length, since mathematical analysis of the variable frequency oscillator of the invention and operational observations on constructed units indicate that the length of line between the T-junction and each magnetron is not a critical parameter. In addition, notice should also be made of the fact that numerous other forms of microwave duplexers well known to the art may be utilized to provide a common output circuit without departing from the spirit and scope of the invention.

Figure 3:
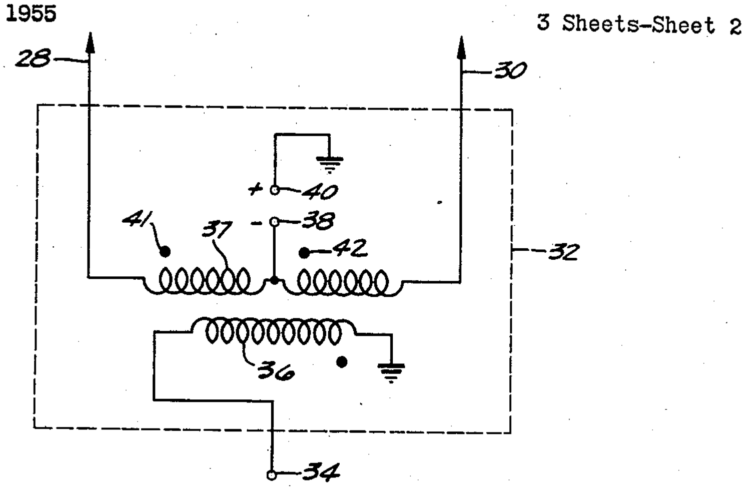
Fig. 3 is a schematic diagram of one form of modulator which may be utilized in the signal generator of Fig. 2.

It will, of course, also be recognized that modulator 32 may comprise any of numerous electrical circuits capable of varying the relative input powers to the magnetrons in push-pull fashion. With reference now to Fig. 3, there is shown one embodiment of a push-pull modulator which may be employed in the frequency modulated signal generator shown in Fig. 2. Basically the modulator comprises a transformer including a primary winding 36 one end of which is grounded and whose other end is connected to input terminal 34, and a center tapped secondary winding 37, the center tap being connected to a negative terminal 38 of a source of DC potential, not shown, a positive terminal 40 of the source being grounded. The ends of winding 37 are in turn connected to conductors 28 and 30, respectively, the two halves of winding 37 being poled as indicated by the dots 41 and 42.

The value of negative potential applied to the center tap of winding 37 is preferably selected to normally maintain the two magnetrons at substantially half their rated power output in the absence of a modulating signal. Accordingly, upon the application of an input signal to input terminal 34 one of the magnetrons may be driven at its rated power output while the other may be reduced to substantially zero power output. It is clear, however, that if a smaller output signal frequency bandwidth can be tolerated the direct current potential applied to the center tapped winding of the modulator transformer may be increased so that the maximum frequency deviation of the output signal still occurs with one or the other of the magnetrons operating at its rated power output.

Figures 4, 6:
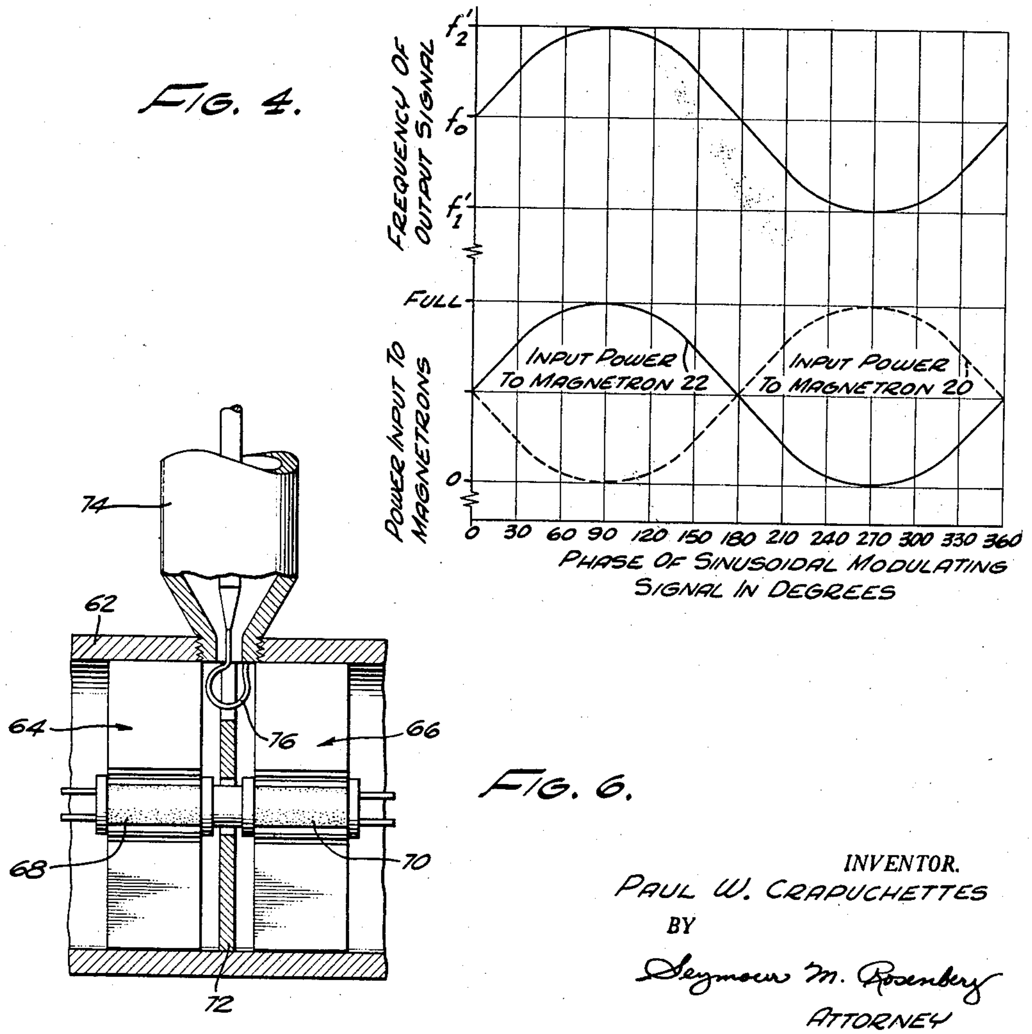
Fig. 4 is a graph illustrating the relationship of the frequency of the output signal from the signal generator shown in Fig. 2 with respect to the relative input powers to the magnetrons employed therein.
Fig. 6 is a diagrammatic view of a twin magnetron tube illustrating another manner in which two oscillator sections may be interconnected.

Assume now that magnetrons 20 and 22 have a quiescent operating point at substantially half rated power and that a sinusoidal modulating signal is applied to input terminal 34. In addition, assume that the amplitude of the modulating signal is just sufficient to drive one of the magnetrons to its full rated power and the other magnetron to cut-off. With reference now to Fig. 4, there is shown a composite graph of the variations in the input power to each magnetron and of the frequency of the synchronized output signal as the modulating signal moves through one cycle. It will be noted that the frequency deviation of the output signal varies sinusoidally with the modulating signal, and varies about its center frequency $f_0$ within the frequency limits $f_1'$ and $f_2'$ which correspond substantially to the preselected frequencies $f_1$ and $f_2$ to which magnetrons 20 and 22, respectively, have been individually adjusted.

The maximum frequency of the modulating signal is limited primarily by the input capacitance of the magnetrons. Inasmuch as this is relatively low, the output signal may be modulated at relatively high frequencies as high as thirty to forty megacycles. Consequently an exceptionally large amount of intelligence information may be included in the frequency modulated signal which is generated.

As pointed out previously, the frequency deviation provided, or in other words, the extent to which the frequency of the output signal may be shifted, is determined by the particular type of magnetrons employed, how tightly the common output circuit couples the magnetrons, and the quiescent operating point of the magnetrons. For example, two Litton 560A magnetrons operating under conditions similar to those shown in Fig. 4 and interconnected by a T-junction duplexer have been operated with a frequency of approximately plus or minus twenty five megacycles about the center frequency.

It has been demonstrated that the frequency deviation may be readily increased to provide shifts of approximately plus or minus one hundred megacycles by merely increasing the coupling in existing magnetrons, and that frequency deviations of plus or minus five hundred megacycles should be obtainable at X-band by utilizing magnetrons whose output waveguide is very tightly coupled to the associated resonant system of the magnetron. It will be recognized by those familiar with the microwave tube art that numerous techniques exist for increasing the degree of output coupling in microwave tubes; for example, in tubes employing iris coupling to an associated output waveguide the coupling can be materially increased by merely increasing the size of the output iris in the resonator wall.

In the foregoing description of Figs. 2, 3 and 4 the application of the electronically tunable microwave oscillator of the invention to the generation of a frequency modulated signal for transmitting intelligence has been disclosed. It is to be expressly understood, however, that the motivating concept of the invention is applicable to numerous other systems wherein an electronically tunable microwave oscillator having a relatively large frequency deviation is required.

Figure 5:
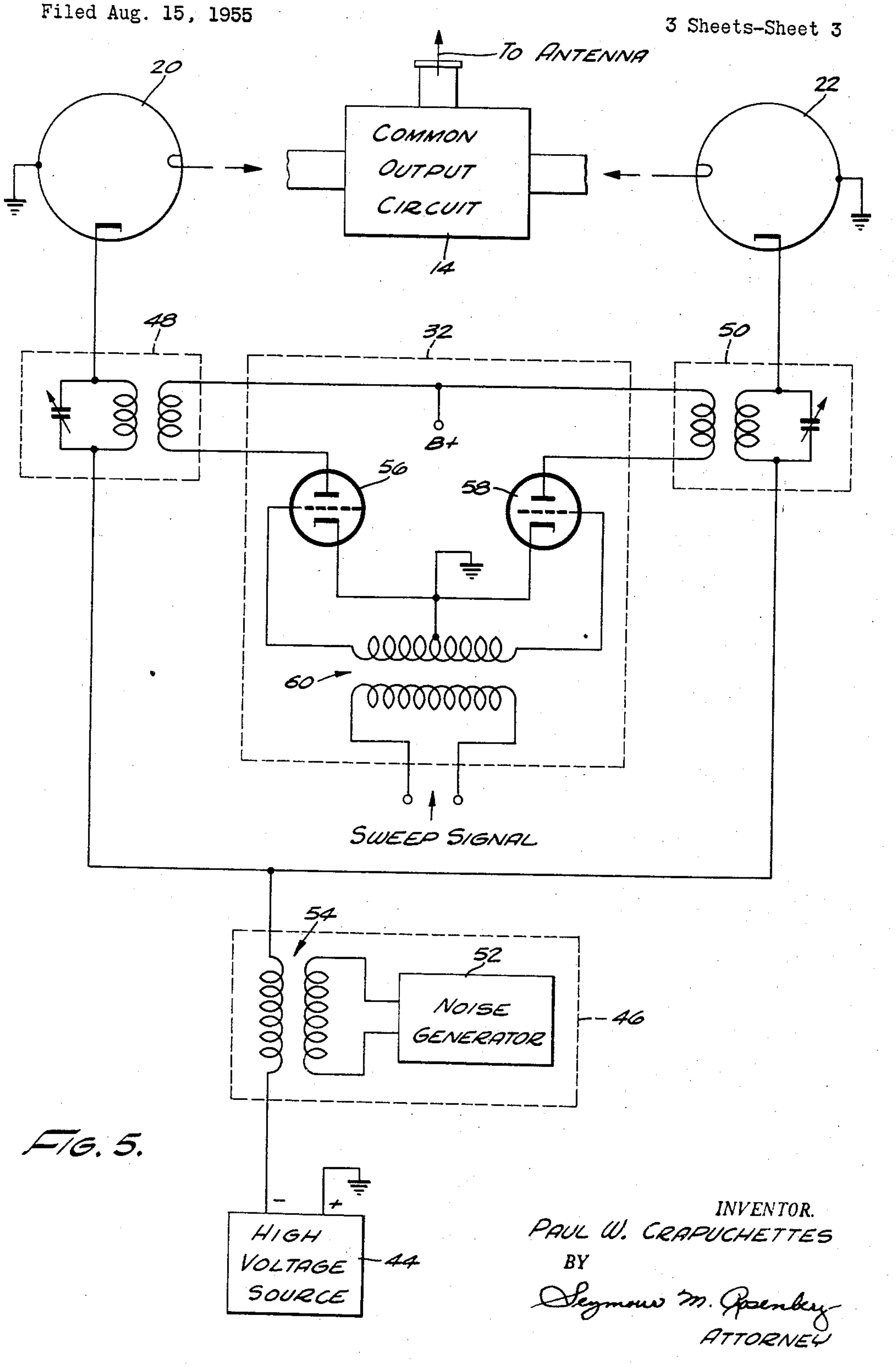
Fig. 5 is a block diagram, partly in schematic form, of a radar jamming system which embodies the tunable microwave oscillator, of the invention.

Referring now to Fig. 5, there is shown a radar jamming signal generator which incorporates the basic concept of the invention. As shown in Fig. 5, the jamming signal generator again includes a pair of magnetrons 20 and 22 which are intercoupled by a common output circuit 14, and a modulator 32 which is operative to very the relative input powers to the magnetrons in push-pull. In addition, the jamming signal generator includes a high voltage source 44, a noise modulator 46 connected to source 44, and a pair of coupling networks 48 and 50 for respectively intercoupling magnetrons 20 and 22 with both push-pull modulator 32 and noise modulator 46.

Noise modulator 46 includes a noise generator 52 which is coupled to the high voltage output conductor from high voltage source 44 through a transformer 54, thereby providing a structure for noise modulating the input current to the magnetrons. It will be recognized of course that noise generator 52 may comprise any suitable noise source known to the art, such as a thyratron.

The output conductor from the noise modulator is in turn applied to one end of a tuned circuit in each of coupling networks 48 and 50, the other ends of the tuned circuits being connected to the cathodes of magnetrons 20 and 22, respectively. The inductor in each of the tuned circuits in turn constitutes one winding of an associated transformer whose other winding is connected to modulator 32, the transformers being energized in push-pull by a pair of vacuum tubes 56 and 58 and in accordance with variations in the magnitude of a modulating sweep signal applied to the vacuum tubes through a transformer 60.

In operation a periodic sweep signal, such as sawtooth or trapezoidal signal, is preferably applied to modulator 32, the variations in the conductance of triodes 56 and 58 produced thereby in turn modulating the input power to the magnetrons in substantially linear fashion. Simultaneously therewith, noise generator 52 is energized to noise modulate the input current to both magnetrons. Consequently the output signal presented by common output circuit 14 is both noise modulated and varies substantially linearly over a relatively wide frequency band. It should be pointed out that the utilization of a linear sweep is only preferred if it is desired to have substantially uniform power density across the spectrum traversed by the output signal, and the jamming signal generator is not to be limited by any particular type of sweep signal.

The frequency bandwidth of the noise signal employed to noise modulate the magnetrons is naturally determined by the characteristics of the radars which it is desired to jam, and may be as high as several megacycles. In a similar manner, the frequency of the sweep signal applied to the push-pull modulator is also selected in view of the characteristics of the radar which are to be jammed. For example, if it is desired to employ the jamming signal generator for jamming a range gated radar each time the gate is open, it may be shown that the frequency of the modulating signal must be relatively high.

In the description of the invention set forth hereinabove with respect to Figs. 2 and 5 it has been assumed that the two oscillator sections comprise two separate and distinct microwave oscillator tubes which are externally intercoupled to provide a synchronized output signal. It will be recognized, however, that two microwave oscillators, such as magnetrons, may be packaged within a common vacuum tube envelope equipped with a common output waveguide to provide a twin magnetron. It is to be expressly understood, therefore, that the invention is intended to encompass both the use of two distinct and separate microwave oscillator tubes, and also the use of a single tube which includes the oscillation generating elements of two microwave oscillators.

Referring now to Fig. 6, there is shown a partial view of one form of microwave tube which might be employed for housing two microwave oscillator sections and for providing a common output circuit. As shown in Fig. 6, the microwave tube is basically a twin magnetron and includes a common anode block 62 which houses two vane type resonant systems generally designated 64 and 66, respectively, and two respectively associated cathodes 68 and 70, each of which is independently energizable and electrically insulated from the other. Each of the resonant systems and its associated cathode is separated from the corresponding elements of the other oscillator section by a conductive disc 72, the disc being apertured at its center to admit a common cathode end hat support and at one side to admit a common output structure 74 which may be a coupling loop 76, for example. If now one of the resonant systems is designed to normally oscillate at frequency *f* and the other is designed to normally oscillate at frequency *f*, the two oscillator sections will synchronize in operation by virtue of the tight intercoupling provided by the aperture in disc 72 and will provide a common output signal whose frequency may be shifted by varying the relative power supplied to the two oscillator sections.

Still another modification which may be made in the basic electronically tunable microwave oscillator of the invention is the incorporation of structure for amplitude modulating the common output signal in accordance with a second modulating signal different from the first modulating signal employed to provide frequency modulation of the output signal. It will be recalled that frequency modulation of the output signal is obtained by varying the relative input powers to the oscillator sections, and that the frequency of the output signal may be maintained substantially constant even though the input power to the oscillator sections is varied provided that their relative input powers remain constant. Accordingly, if the relative input powers to the oscillator sections are varied in accordance with one modulating signal while the absolute magnitudes of the input powers to the oscillator sections are varied in accordance with a second modulating signal, then an output signal which is both amplitude and frequency modulated may be generated.

It is clear of course that numerous other modifications and alterations may be made in the basic variable frequency oscillators herein disclosed without departing from the invention. For example, the oscillator sections employed therein may comprise either continuous wave or pulsed oscillators. Accordingly, it is to be expressly understood that the scope of the invention is to be limited only by the spirit and scope of the appended claims.

What is claimed as new is:

1. An electronically tunable microwave oscillator comprising: a first microwave oscillator section having an output circuit, said first oscillator section being tuned to a first frequency; a second microwave oscillator section having an output circuit, said second oscillator section being tuned to a second frequency; means connected to said first and second oscillator sections for varying the relative input powers to said sections; and output means connected to said output circuit of each of said oscillator sections for intercoupling said oscillator sections whereby said sections are operable in synchronism to produce an output signal whose frequency is variable in accordance with variations in the relative input powers to said sections.

2. The electronically tunable microwave oscillator defined in claim 1 wherein said first and second microwave oscillator sections are magnetrons.

3. The electronically tunable microwave oscillator defined in claim 2 wherein said output means is a T-junction duplexer having a series arm and first and second shunt arms, said first and second shunt arms being connected to said output circuits of said first and second magnetrons, respectively.

4. The electronically tunable microwave oscillator defined in claim 1 wherein said first and second oscillator sections are magnetrons, both of said magnetrons being encapsulated within one vacuum tube envelope.

5. A broadband variable frequency microwave oscillator for generating a high power output signal, said oscillator comprising: first and second microwave oscillator sections tuned to predetermined frequencies $f_1$ and $f_2$, respectively, each of said oscillator sections having an output circuit; first means for supplying input power to each of said oscillator sections; output means for electrically intercoupling the output circuits of said oscillator sections whereby said oscillator sections are operable in synchronism at a frequency intermediate frequencies $f_1$ and $f_2$ and determined by the relative input powers to said sections; and second means coupled to said first means for selectively varying the relative input powers to said oscillator sections, said oscillator sections being responsive to a change in their relative input powers for shifting their synchronized frequency of oscillation toward the predetermined frequency of the oscillator section whose relative input power is increasing.

6. The microwave oscillator defined in claim 5 wherein said oscillator sections are magnetrons.

7. The microwave oscillator defined in claim 6 wherein said first means supplies substantially one half the rated power input to each of said magnetrons when the power supplied to one of said magnetrons is equal to the power supplied to the other of said magnetrons.

8. The microwave oscillator defined in claim 6 wherein said output means comprises an H-plane T-junction duplexer having first and second shunt arms and a series arms, said first and second shunt arms being connected to the output circuits of said first and second oscillator sections, respectively, the high power output signal being presented at said series arm of said T-junction.

9. A variable frequency microwave oscillator which is electronically tunable over a relatively broad frequency band, said oscillator comprising: first and second microwave oscillator sections tuned to different frequencies; means for tightly intercoupling said oscillator sections whereby said sections are operable in synchronism; means for applying input power to each of said oscillator sections, and means for varying the relative input powers to said oscillator sections whereby the synchronized frequency of operation of said oscillator sections may be varied.

10. The variable frequency oscillator defined in claim 9 wherein said first and second oscillator sections and said first named means comprise a twin magnetron having a common output structure.

11. The variable frequency oscillator defined in claim 9 wherein the frequencies to which said first and second oscillator sections are tuned are at opposite ends of the frequency band over which the variable frequency oscillator is tunable.

12. A variable frequency oscillator for generating a frequency modulated microwave signal whose frequency is shiftable about a center frequency in accordance with variations in an applied modulating signal, said oscillator comprising: first and second oscillator sections tuned to first and second frequencies, respectively; a common output circuit tightly intercoupling said oscillator sections whereby said oscillator sections are operable in synchronism; and a common input power source for supplying energy to said oscillator sections, said input power source including means responsive to the modulating signal for varying the relative input energy to said oscillator sections in accordance with variations in the modulating signal whereby the frequency of operation of said synchronized oscillator sections varies in accordance with variations in the modulating signal.

13. The variable frequency oscillator defined in claim 12 which further includes a noise modulator coupled to said oscillator sections for noise modulating the input power to each of said sections.

No references cited.